US010555438B2

(12) United States Patent
Chang

(10) Patent No.: US 10,555,438 B2
(45) Date of Patent: Feb. 4, 2020

(54) HEAT DISSIPATION STRUCTURE AND ELECTRONIC DEVICE HAVING THE SAME

(71) Applicant: Chiun Mai Communication Systems, Inc., New Taipei (TW)

(72) Inventor: Yu-Wei Chang, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 16/169,955

(22) Filed: Oct. 24, 2018

(65) Prior Publication Data

US 2019/0166721 A1     May 30, 2019

(30) Foreign Application Priority Data

Oct. 26, 2017   (CN) .......................... 2017 1 1037793

(51) Int. Cl.
*H05K 7/20* (2006.01)
*C09K 5/04* (2006.01)

(52) U.S. Cl.
CPC .......... *H05K 7/20336* (2013.01); *C09K 5/04* (2013.01); *H05K 7/20309* (2013.01); *H05K 7/20318* (2013.01)

(58) Field of Classification Search
CPC ......... H01L 23/473; H01L 2224/16225; H01L 23/467; H01L 2223/6677; F28D 15/0266; F28D 15/0233; F28D 15/0275; F28D 15/00; G06F 1/203; G06F 1/20; G06F 2200/201; G06F 1/206; B23P 2700/09; H05K 7/20309; H05K 7/20336; H05K 7/20318; H05K 1/0203; H05K 7/2099; F28F 1/40; F28F 3/086; F28F 13/182; H04M 1/026; F25B 2321/025; F25B 39/04; H01Q 9/40; F28C 3/02; F28C 3/04; F28C 3/12
See application file for complete search history.

(56) References Cited

U.S. PATENT DOCUMENTS

| | | | | |
|---|---|---|---|---|
| 1,871,492 A * | 8/1932 | Brennecke | ........... | H01G 13/003 156/228 |
| 6,377,219 B2 * | 4/2002 | Smith | ...................... | H01Q 1/02 165/182 |
| 6,437,981 B1 * | 8/2002 | Newton | .............. | B81C 1/00119 165/104.26 |
| 8,069,909 B2 * | 12/2011 | Qin | ........................ | H01L 23/427 165/104.33 |
| 8,395,898 B1 * | 3/2013 | Chamseddine | ....... | F28D 7/0075 361/694 |
| 9,547,344 B2 * | 1/2017 | Han | ........................ | G06F 1/203 |
| 10,194,521 B2 * | 1/2019 | Kim | ........................ | H02J 7/025 |

(Continued)

FOREIGN PATENT DOCUMENTS

| | | |
|---|---|---|
| CN | 102577654 A | 7/2012 |
| CN | 105655689 A | 6/2016 |
| CN | 106535565 A | 3/2017 |

*Primary Examiner* — Hung S. Bui
*Assistant Examiner* — Michael A Matey
(74) *Attorney, Agent, or Firm* — ScienBiziP, P.C.

(57) ABSTRACT

A heat dissipation structure comprises a channel structure and a cooling material received and sealed in the channel structure. The cooling material is a low-boiling-point electrical insulating fluid. The channel structure is made of an electrical insulating material. The channel structure comprises an evaporation portion, a condenser portion, and at least one channel connecting the evaporation portion and the condenser portion. An electronic device using the heat dissipation structure is also provided.

11 Claims, 5 Drawing Sheets

(56) References Cited

U.S. PATENT DOCUMENTS

| | | | |
|---|---|---|---|
| 2002/0131237 A1* | 9/2002 | Snyder | F28D 15/0233 361/719 |
| 2004/0244397 A1* | 12/2004 | Kim | G06F 1/203 62/259.2 |
| 2005/0081546 A1* | 4/2005 | Maul | F25D 19/00 62/259.2 |
| 2010/0072952 A1* | 3/2010 | Nakajima | H04B 1/036 320/150 |
| 2010/0124012 A1* | 5/2010 | Kondo | G06F 1/20 361/679.47 |
| 2012/0211203 A1* | 8/2012 | Chang | F28D 15/0233 165/104.26 |
| 2013/0329368 A1* | 12/2013 | Degner | G06F 1/20 361/707 |
| 2014/0020869 A1* | 1/2014 | Davidson | F28D 15/0241 165/104.21 |
| 2014/0138059 A1* | 5/2014 | Ambrose | B64G 1/503 165/104.26 |
| 2014/0262160 A1* | 9/2014 | Vadakkanmaruveedu | F28D 15/02 165/104.33 |
| 2014/0262161 A1* | 9/2014 | Weigand | G06F 1/203 165/104.33 |
| 2014/0352926 A1* | 12/2014 | Sun | G06F 1/203 165/104.26 |
| 2015/0055300 A1* | 2/2015 | Hsieh | G06F 1/20 361/700 |
| 2015/0062821 A1* | 3/2015 | Yoshikawa | G06F 1/20 361/700 |
| 2015/0136362 A1 | 5/2015 | Yoshikawa | |
| 2015/0174709 A1* | 6/2015 | Rice | B23P 15/26 29/890.038 |
| 2015/0220122 A1* | 8/2015 | Rhee | G06F 1/203 361/679.52 |
| 2015/0351282 A1* | 12/2015 | Fujiwara | H05K 7/2099 361/696 |
| 2016/0003503 A1* | 1/2016 | Novisoff | F25B 21/02 62/3.3 |
| 2016/0259383 A1* | 9/2016 | Shioga | F28D 15/0266 |
| 2017/0295671 A1* | 10/2017 | Chiriac | G06F 1/203 |
| 2018/0049346 A1* | 2/2018 | Chiriac | F28D 15/0233 |
| 2018/0264911 A1* | 9/2018 | Won | B60H 1/00 |
| 2018/0356156 A1* | 12/2018 | Hurbi | F28C 3/08 |

\* cited by examiner

HEAT DISSIPATION STRUCTURE AND ELECTRONIC DEVICE HAVING THE SAME

FIELD

The subject matter herein generally relates to a heat dissipation structure, and an electronic device having the heat dissipation structure.

BACKGROUND

Electronic devices usually comprise electronic elements, such as central processing units (CPUs), which may generate heat when in operation. Heat sinks are usually used in the electronic devices for dissipating the heat generated by the electronic elements. However, structures of heat sinks are usually complicated and are voluminous. The heat sinks may take up a large amount of space of the electronic device. Therefore, the usage of heat sinks in electronic devices may impede the progress of electronic device miniaturization. Improvement in the art is preferred.

BRIEF DESCRIPTION OF THE DRAWINGS

Implementations of the present disclosure will now be described, by way of example only, with reference to the attached figures.

DETAILED DESCRIPTION

Figure 1:
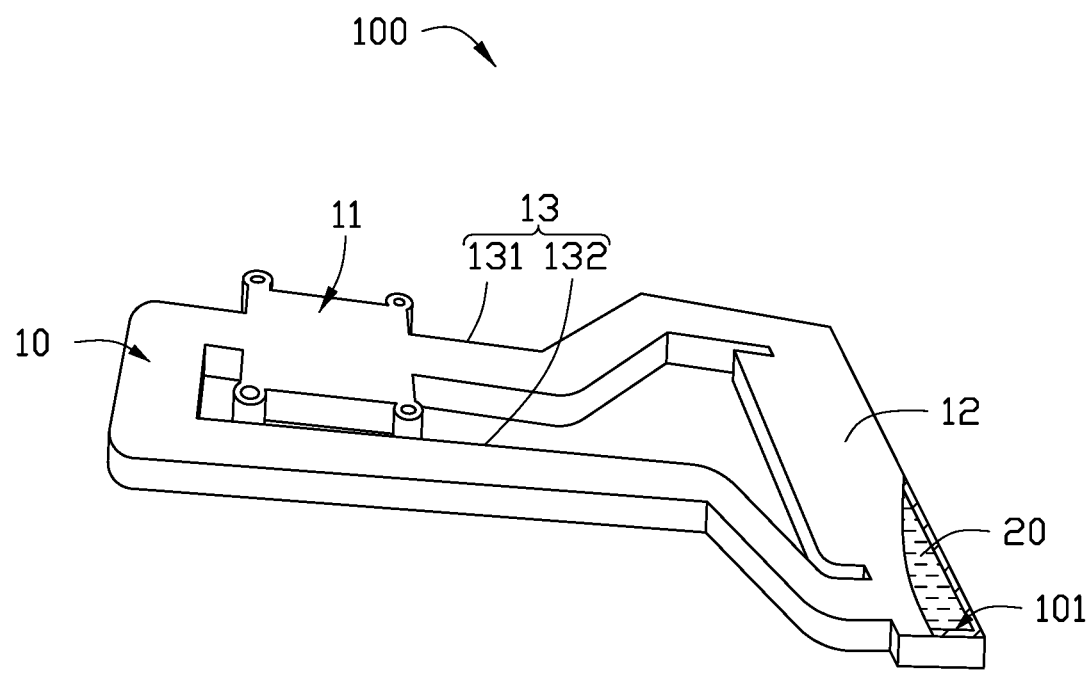
FIG. 1 is a diagrammatic view of an embodiment of a heat dissipation structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

FIG. 1 illustrates an embodiment of a heat dissipation structure 100. The heat dissipation structure 100 comprising a channel structure 10 and a cooling material 20 received and sealed in the channel structure 10.

The channel structure 10 is made of an electrical insulating material, and comprises an inner surface 101 which is a smooth surface without capillary structures. The channel structure 10 comprises an evaporation portion 11, a condenser portion 12, and at least one channel 13 connecting the evaporation portion 11 and the condenser portion 12.

The evaporation portion 11 is attached to a heat source. The cooling material 20 in the evaporation portion 11 absorbs the heat from the heat source to evaporate to become gaseous, and the cooling materials 20 in gas form flows to the condenser portion 12 through the at least one channel 13. The cooling material 20 in the condenser portion 12 dissipates heat to an external environment to condense to become liquid, the cooling material 20 in liquid form flows back to the evaporation portion 11 through the at least one channel 13.

The cooling material 20 can be an electrical insulating fluid with a low boiling point. The boiling point of the cooling material 20 is lower than an operating temperature of the heat source. So that the heat dissipation structure 100 to contain a good thermal performance. In at least one embodiment, the cooling material 20 is a fluorinated liquid, such as Novec 7100 (trade name, available commercially from Minnesota Mining and Manufacturing).

Referring to FIG. 1, in at least one embodiment the channel structure 10 is annular, and the at least one channel 13 comprises a first channel 131 and a second channel 132. The evaporation portion 11, the first channel 131, the condenser portion 12 and the second channel 132 are annularly connected and communicated in that sequence.

In at least one embodiment, The cooling material 20 in the evaporation portion 11 absorbs the heat from a heat source and evaporate to become gaseous, and the cooling material 20 in gas form flows to the condenser portion 12 through the first channel 131. The gaseous cooling material 20 in the condenser portion 12 dissipates heat to an external environment and condense to become liquid, and the cooling material 20 in liquid form flows back to the evaporation portion 11 through the second channel 132.

In another embodiment, a shape of the channel structure 10 can vary, such as cambered, linear, polygonal, and so on. The number of the channel 13 can vary, such as one, three, and so on.

Figure 2:
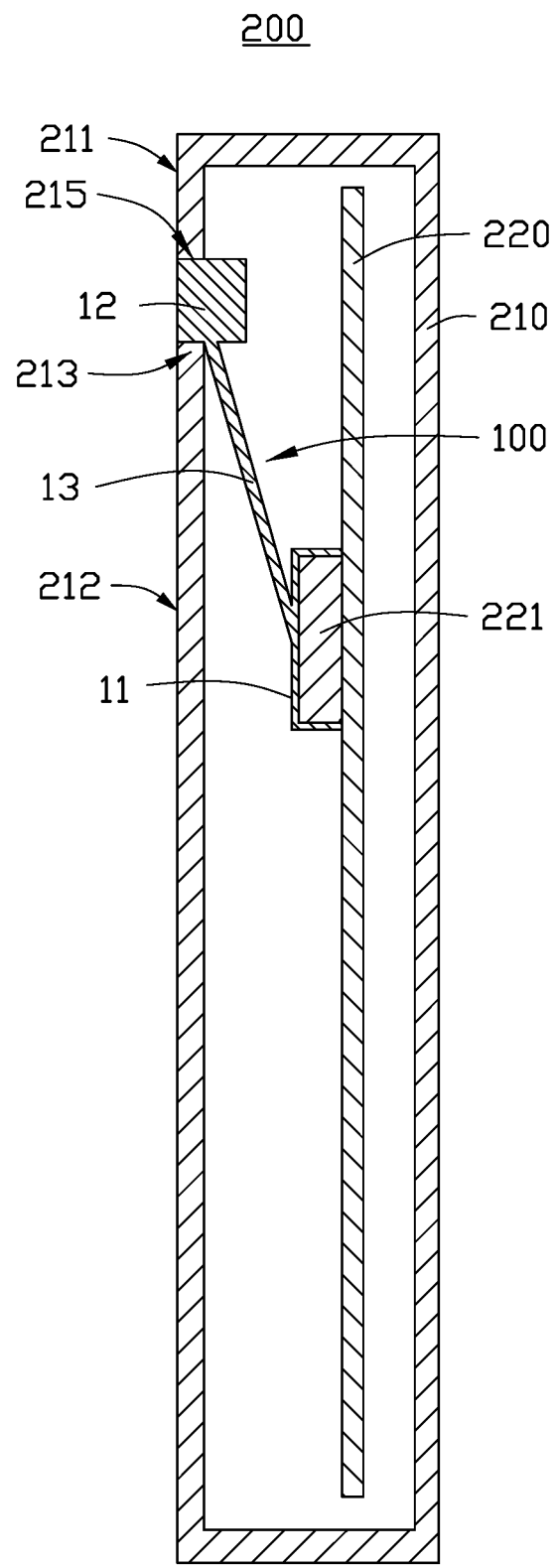
FIG. 2 is a cross-sectional view of an electronic device having the heat dissipation structure of FIG. 1.

FIG. 2 illustrates an embodiment of an electronic device 200. The electronic device 200 comprises a housing 210, the heat dissipation structure 100, and an electronic element 220. The electronic element 220 is received in the housing 210. The electronic element 220 comprises a heat source 221 (such as CPU). The condenser portion 12 is embedded in the housing 210 and is exposed to the external environment outside the housing 210.

Referring to FIG. 2, in a first embodiment the housing 210 comprises an antenna portion 211, a non-antenna portion 212, and a partition portion 213 connecting the antenna portion 211 and the non-antenna portion 212.

In at least one embodiment, the partition portion 213 defines an opening 215.

The heat dissipation structure 100 is received in the housing 210. The evaporation portion 11 is received in the housing 210 and is attached to the heat source 221. The at least one channel 13 is received in the housing 210. The condenser portion 12 is embedded in the partition portion 213.

In at least one embodiment, the condenser portion 12 is embedded in the opening 215 to be exposed to the external environment outside the housing 210, thus, reducing a volume of the electronic device 200, and dissipating heat to the external environment. The heat dissipation structure 100 does not affect functions of the partition portion 213.

In at least one embodiment, the condenser portion 12 and the partition portion 213 are separable. In another embodiment, the condenser portion 12 and the partition portion 213 are integrally formed.

Figure 3:
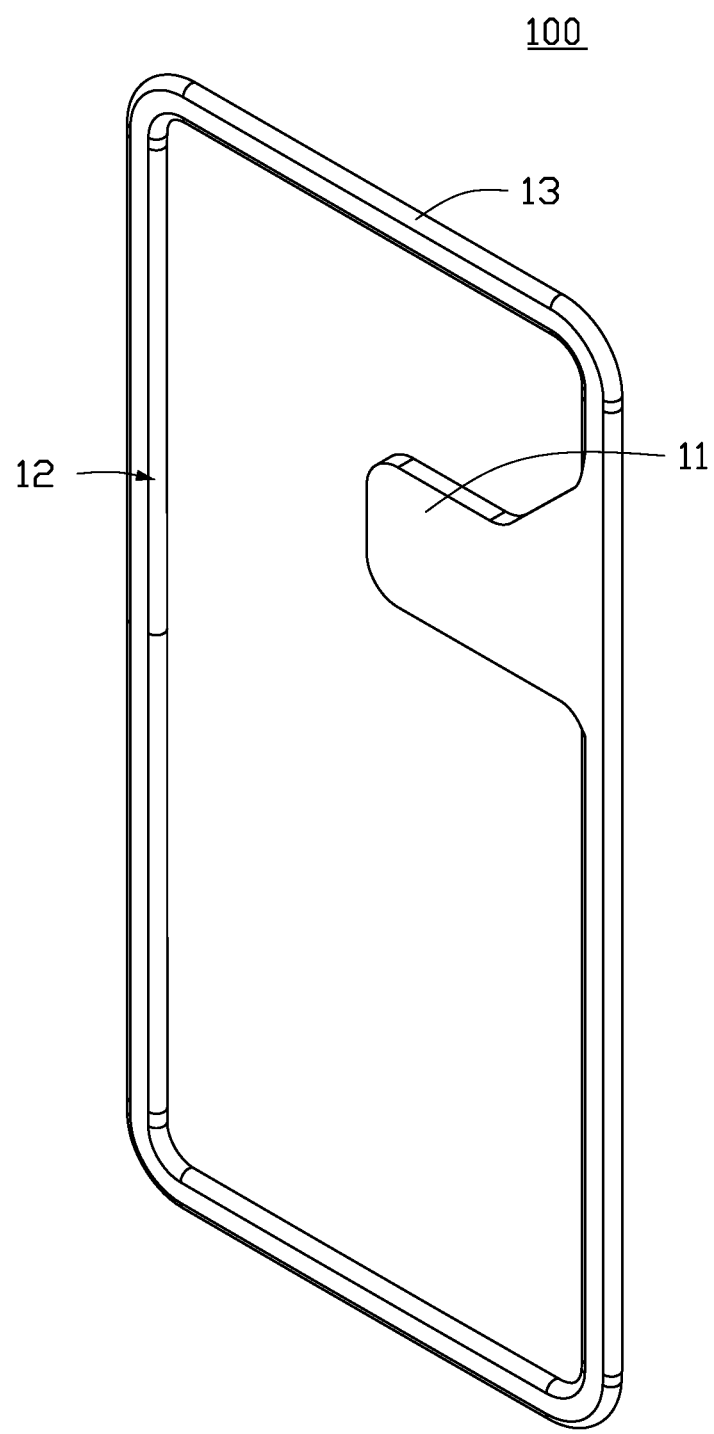
FIG. 3 is a diagrammatic view of another embodiment of a heat dissipation structure.
Figure 4:
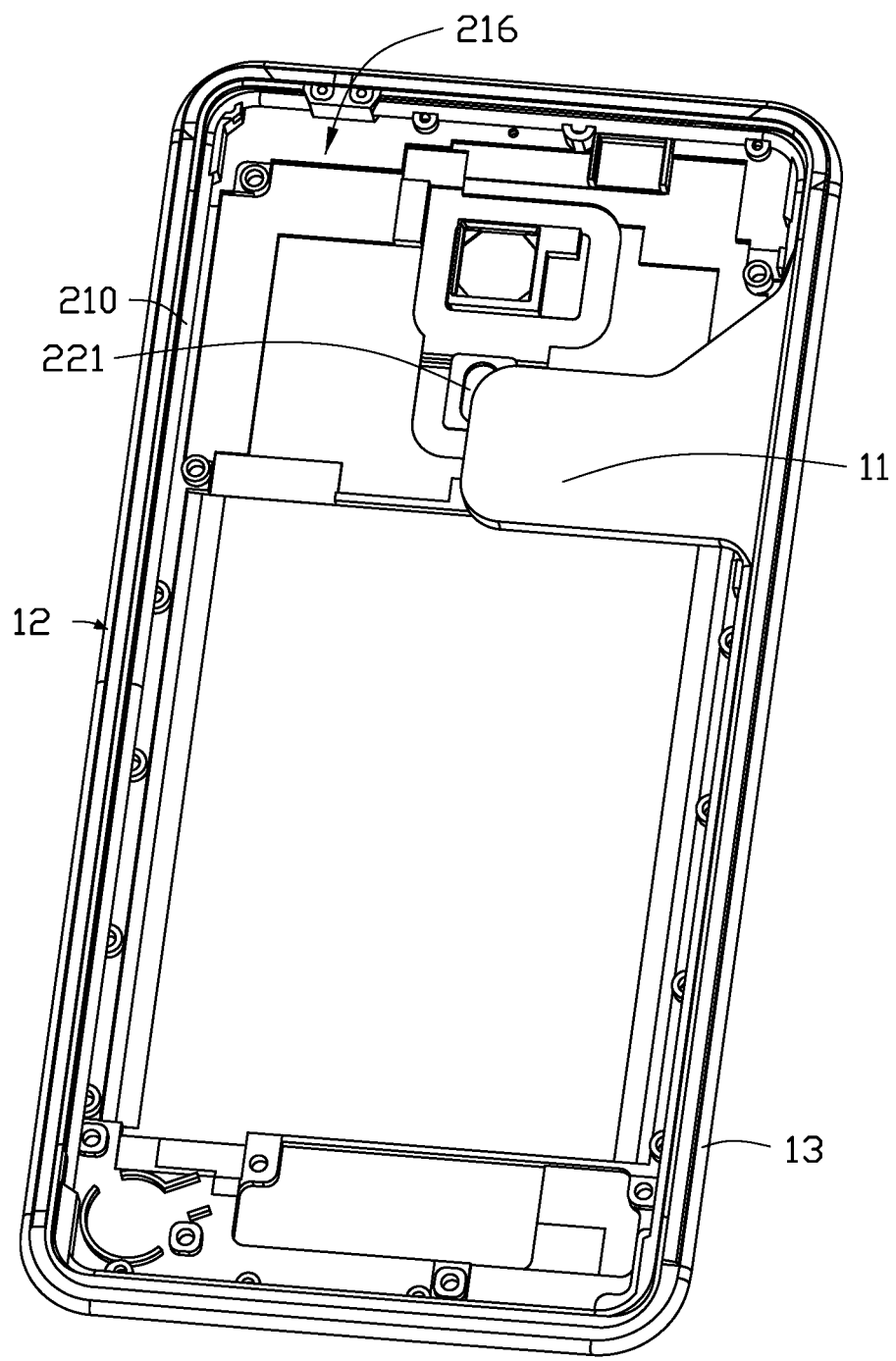
FIG. 4 is a diagrammatic view of another embodiment of an electronic device having the heat dissipation structure of FIG. 3.

Referring to FIGS. 3 and 4, in another embodiment the evaporation portion 11 is received in the housing 210 and is attached to the heat source 221, the at least one channel 13 and the condenser portion 12 are embedded in the housing 210 and are exposed to the external environment outside the housing 210, thereby saving the space of the electronic device 200.

Figure 5:
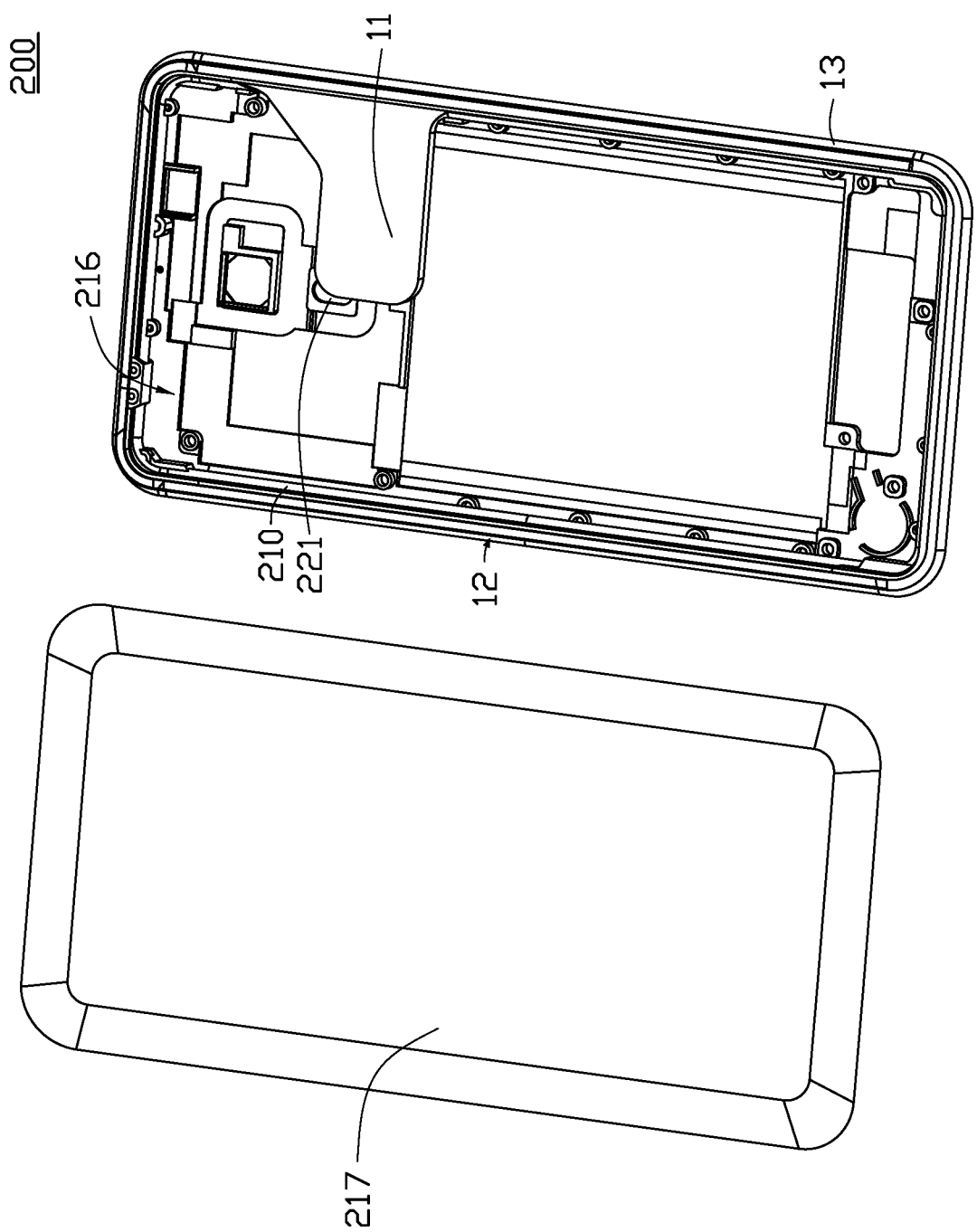
FIG. 5 is an exploded, diagrammatic view of another embodiment of an electronic device having a heat dissipation structure.

Referring to FIG. 5, in another embodiment the housing 210 comprises a front cover 216 and a rear cover 217. The at least one channel 13 and the condenser portion 12 are sandwiched between the front cover 216 and the rear cover 217 to connect the front cover 216 to the rear cover 217.

In at least one embodiment, only the at least one channel 13 is sandwiched between the front cover 216 and the rear cover 217 and to connect the front cover 216 to the rear cover 217.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An electronic device comprising:
a housing;
a heat source received in the housing; and
a heat dissipation structure comprising:
a channel structure; and
a cooling material received and sealed in the channel structure;
wherein the cooling material is an electrical insulating fluid with a low boiling point below an operating temperature of the heat source, the channel structure is made of an electrical insulating material, the channel structure comprises an evaporation portion, a condenser portion, and at least one channel connecting the evaporation portion and the condenser portion, the evaporation portion is attached to the heat source; the condenser portion is embedded in the housing and exposed to an external environment outside the housing; the housing comprises an antenna portion, a non-antenna portion, and a partition portion connecting the antenna portion and the non-antenna portion, the partition portion defines an opening, the condenser portion is embedded in the opening.

2. The electronic device of the claim 1, wherein the cooling material is a fluorinated liquid.

3. The electronic device of the claim 1, wherein the condenser portion and the partition portion are separable.

4. The electronic device of the claim 1, wherein the condenser portion and the partition portion are integrally formed.

5. The electronic device of the claim 1, wherein the at least one channel is embedded in the housing and is exposed to the external environment outside the housing.

6. The electronic device of the claim 1, wherein the housing comprises a front cover and a rear cover, the at least one channel is sandwiched between the front cover and the rear cover and connects the front cover to the rear cover.

7. The electronic device of the claim 6, wherein the condenser portion is sandwiched between the front cover and the rear cover and connects the front cover to the rear cover.

8. The electronic device of the claim 7, wherein the channel structure is annular, and the at least one channel comprises a first channel and a second channel, the evaporation portion, the first channel, the condenser portion and the second channel are sequentially and annularly connected and in air communication with one another.

9. The electronic device of the claim 8, wherein the first channel, the condenser portion and the second channel are sandwiched between the front cover and the rear cover and cooperatively connect the front cover to the rear cover.

10. The electronic device of the claim 1, wherein the channel structure is linear.

11. The electronic device of the claim 10, wherein the condenser portion is embedded in the housing and is exposed to an external environment outside the housing, the at least one channel is received in the housing.

* * * * *